United States Patent [19]

Makino et al.

[11] 4,225,796
[45] Sep. 30, 1980

[54] FREQUENCY-TO-CURRENT CONVERSION CIRCUIT

[75] Inventors: Tomoatsu Makino, Okazaki; Yoshio Hirano, Anjo; Katsuteru Miwa, Kariya, all of Japan

[73] Assignee: Nippondenso Co., Ltd., Kariya, Japan

[21] Appl. No.: 967,497

[22] Filed: Dec. 7, 1978

[30] Foreign Application Priority Data

Feb. 14, 1978 [JP] Japan .................................. 53-16129

[51] Int. Cl.³ .............................................. H03K 1/08
[52] U.S. Cl. ........................................ 307/261; 307/270
[58] Field of Search ................ 307/261, 270, 271, 273

[56] References Cited

U.S. PATENT DOCUMENTS

| 3,836,853 | 9/1974 | Cracraft et al. ............... 307/261 X |
| 4,015,145 | 3/1977 | Stewart ....................... 307/273 X |
| 4,031,414 | 6/1977 | Giles et al. .................... 307/270 |

Primary Examiner—John S. Heyman
Attorney, Agent, or Firm—Cushman, Darby & Cushman

[57] ABSTRACT

A frequency-to-current conversion circuit comprises a charge/discharge circuit for charging or discharging with a first constant current in synchronism with each cycle of an input pulse signal having a varying frequency, a voltage comparison circuit for detecting a predetermined voltage attained by the charge/discharge circuit at the expiration of a predetermined time interval dependent on the value of the first constant current from the beginning of the charge or discharge, and an output circuit for receiving the output signal of the voltage comparison circuit as well as the input pulse signal to generate a second constant current during the predetermined time interval in synchronism with each cycle of the input pulse signal.

10 Claims, 8 Drawing Figures

FREQUENCY-TO-CURRENT CONVERSION CIRCUIT

The present invention relates to a frequency-to-current conversion circuit of the type which generates a current proportional to the frequency of an input pulse signal, and more particularly the invention relates to a frequency-to-current conversion circuit designed so that the current quantity of its output current can be set as desired within a wider range of values and an improved matching with a variety of instruments such as a frequency indicating meter can be ensured.

It is therefore the object of the invention to provide a frequency-to-current conversion circuit wherein charging or discharging is skillfully effected with a constant current in response to an input pulse signal, and a comparison output signal indicative of whether a charged or discharged voltage depending on the charging or discharging operation has attained a predetermined value and the input pulse signal are utilized, whereby a signal synchronized with each cycle of the input pulse signal is generated by the two signals and a constant current is generated by the signal, thus making it possible to set the current quantity of output current as desired to thereby ensure an improved matching with various meters and instruments and also making it possible, through frequency-to-voltage conversion of output current, to increase the resulting output up to practically the power supply voltage.

These and further objects and advantages of the invention will appear more fully from the following description taken in conjunction with the accompanying drawings, in which.

The present invention will now be described in greater detail with reference to the illustrated embodiments.

Figure 1:
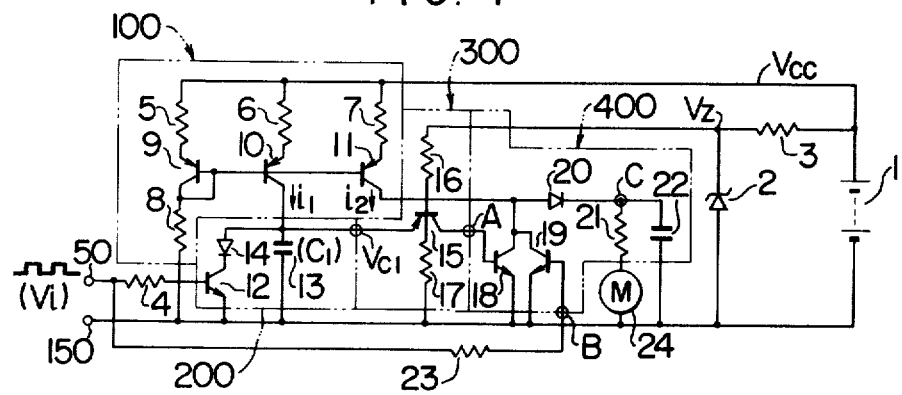
FIG. 1 is an overall circuit diagram showing an embodiment of a frequency-to-current conversion circuit according to the invention.

Referring first to FIG. 1, there is illustrated an overall circuit diagram showing an embodiment of a frequency-to-current conversion circuit according to the invention which is intended for its realization with a monolithic IC, and it comprises, as its principal blocks, a current supply circuit 100 for generating different constant currents, a charge/discharge circuit 200, a voltage comparison circuit 300 and an output circuit 400 for generating a current output. In the Figure, numeral 1 designates a DC power source such as a battery, 2 a Zener diode for regulating a voltage Vcc supplied from the power source 1 at a constant voltage Vz, 3, 4 and 23 input resistors, 24 a known type of meter such as ammeter, and 50 an input terminal for receiving a pulse signal Vi (shown in (Vi) of FIG. 2) having a varying frequency. In the case of an instrument installed in a vehicle, the pulse signal Vi is in the form of a vehicle engine speed signal, vehicle wheel speed signal or the like. Numeral 150 designates a grounding terminal. The current supply circuit 100 has a circuit construction which is frequently used in the internal circuits of semiconductor IC's and it comprises resistors 5, 6, 7 and 8 and transistors 9, 10 and 11 the bases of which are connected with each other. It is well known that by suitably selecting the value of these elements, particularly the resistors 6 and 7 and the transistors 10 and 11, the ratio between first and second constant currents $i_1$ and $i_2$ can be maintained constant irrespective of changes in an ambient temperature, a voltage across the power source 1 or the like, and it is assumed here that the constants of the circuit elements are selected so that $ni_1 = i_2$. The transistor 9 is used to provide temperature compensation for the absolute values of the first and second constant currents $i_1$ and $i_2$ and it also serves the purpose of level shifting to prevent the transistors 10 and 11 from being cut off when the power supply voltage drops. The resistors 5 and 8 are important in determining the absolute value of the constant currents $i_1$ and $i_2$, respectively.

The charge/discharge circuit 200 comprises a transistor 12 which is turned on and off in response to the pulse signal Vi applied through the resistor 4, a charging and discharging capacitor 13 and a diode 14 connected in series with the transistor 12. The voltage comparison circuit 300 comprises a transistor 15 for comparing the terminal voltage of the capacitor 13 with a reference voltage and voltage dividing resistors 16 and 17 for applying the comparison reference voltage to the base of the transistor 15. The output circuit 400 comprises transistors 18 and 19 constituting a NOR logic circuit, a diode 20, a resistor 21 and a capacitor 22, whereby only when a low level signal is applied to the base input terminals A and B of the transistors 18 and 20, a terminal C provided between the diode 20 and the resistor 21 goes to a high level and the second constant current $i_2$ is generated from the transistor 11 by way of the diode 20.

With the construction described above, the operation of the circuit according to the invention will now be described with reference to FIG. 2. When the rectangular pulse signal Vi applied to the input terminal 50 is at the high level as shown in (Vi) of FIG. 2, the transistor 12 is in the ON condition in the charge/discharge circuit 200 and the capacitor 13 is discharging or has completed its discharge through the diode 14 and the transistor 12 as shown in ($V_{C1}$) of FIG. 2 thus substantially maintaining its terminal voltage $V_{C1}$ at $V_D$ ($V_D$ is the forward voltage drop of the diode 14). The transistor 19 is also in the ON condition in the output circuit 400, so that the second constant current $i_2$ from the current supply circuit 100 is absorbed by the transistor 19 and no current flows to the terminal C.

Figure 2:
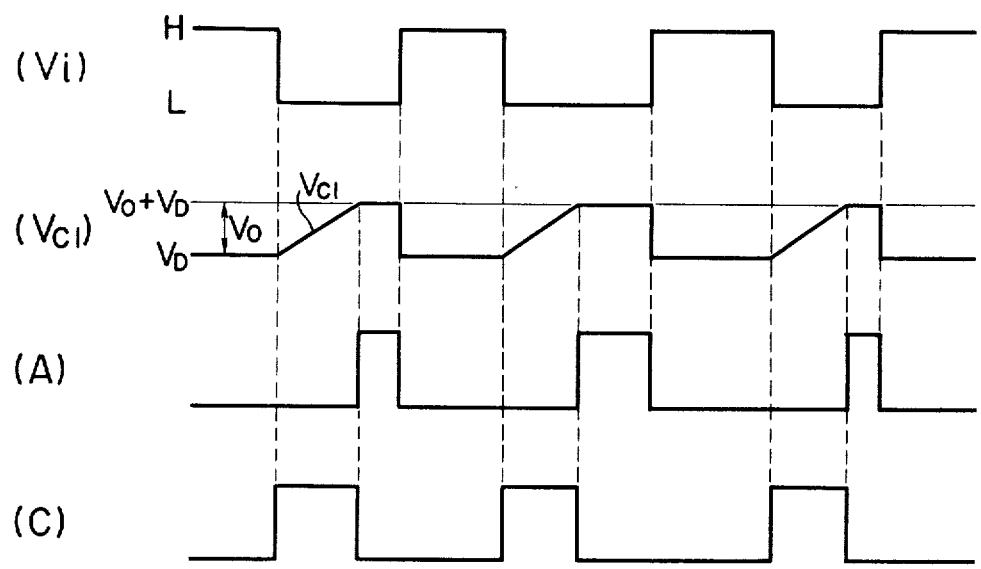
FIG. 2 is a signal waveform useful in explaining the operation of the circuit according to the invention.

On the other hand, when the pulse signal Vi goes to the low level as show in (Vi) of FIG. 2, the transistors 12 and 19 are both turned off and the capacitor 13 starts to charge with the first constant current $i_1$ as shown in ($V_{C1}$) of FIG 2. The terminal voltage $V_{C1}$ or the voltage across the capacitor 13 increases with a fixed slope, so that the transistor 15 is held off and the transistor 18 is also held off until the voltage $V_{C1}$ reaches a reference voltage $V_O + V_D$ or
$V_O + V_D = [\{R_{17}/(R_{16} + R_{17})\}V_Z + V_{BE} - V_D] + V_D$
which is dependent on the resistance values $R_{16}$ and $R_{17}$ of the resistors 16 and 17, the voltage $V_{BE}$ between the vase and emitter of the transistor 15 and the forward voltage drop $V_D$ of the diode 14. As a result, both transistors 18 and 19 are turned off for a certain time interval until the terminal voltage $V_{C1}$ of the capacitor 13 reaches the predetermined reference voltage $V_O + V_D$.

During this time interval the second constant current $i_2$ is supplied from the transistor 11 to the terminal C as shown in (C) of FIG. 2.

When the terminal voltage $V_{C1}$ reaches the reference voltage $V_O + V_D$ during the charging of the capacitor 13, the transistor 15 is turned on applying the current signal shown in (A) of FIG. 2 to the base of the transistor 18 and the transistor 18 is turned on. Consequently, even when the pulse signal Vi is at the low level, the second constant current $i_2$ is absorbed by the transistor 18 and no current is supplied to the terminal C as shown in (C) of FIG. 2.

Thereafter, when the pulse signal $V_1$ goes to the high level again, the transistor 12 is turned on and the charge on the capacitor 13 is discharged through the diode 14 and the emitter-collector path of the transistor 12. Consequently, the terminal voltage $V_{C1}$ becomes equal to the voltage drop $V_D$ of the diode 14 and the transistor 19 is also turned on, thus supplying no current to the terminal C as mentioned previously. Thereafter the previously mentioned process is repeated.

The charge quantity Q which is supplied through the terminal C to the ammeter 24 during one cycle of the pulse signal Vi is given by $Q = C_1 \cdot V_O \cdot (i_2/i_1)$. In this case, $V_O$ is fixed and the voltages $V_{BE}$ and $V_D$ constituting the important elements of $V_O$ are practically equal to each other and also connected in reverse relation so as to cancel with respect to the temperature characteristics.

Consequently, if the pulse signal Vi changes f times in one second, the average output current I is given by $I = Q \cdot f = C_1 \cdot V_O \cdot (i_2/i_1) \cdot f$ (f is the frequency of the pulse signal Vi). On the other hand, since the first and second constant currents $i_1$ and $i_2$ are predetermined so that $n i_1 = i_2$, then the average output current I is given by $I = n \cdot C_1 \cdot V_O \cdot f$.

In this case, since n $C_1$ and $V_O$ are fixed, the output current I is proportional to the frequency f of the input pulse signal Vi. The values of n, $C_1$ and $V_O$, particularly the value of $n = i_2/i_1$ is adjustable as desired by suitably selecting the constants of the resistors 6 and 7 and the transistors 10 and 11 in the current supply circuit 100, even when the value of the capacitance $C_1$ is small, the output current I can be increased easily. On the other hand, since the supply line of the current supply circuit 100 can be directly connected to the power source 1, the second constant current $i_2$ can be made sufficiently large without giving rise to any problem. Moreover, since n represents the ratio between the first and second constant currents $i_1$ and $i_2$ and both the currents $i_1$ and $i_2$ change with a change in the supply voltage Vcc, the ratio n is maintained substantially constant and consequently the output current I is generated stably against changes in the supply voltage. With the circuit of this invention, since its output current can be changed as desired by particularly adjusting the value of n as mentioned previously, there is a great advantage that not only the cost of the circuit can be reduced by using the capacitor 13 of a small capacitance value but also the circuit can be adjusted as desired to suit the specification of any one of various meters, such as the ammeter 24.

Figure 3A:
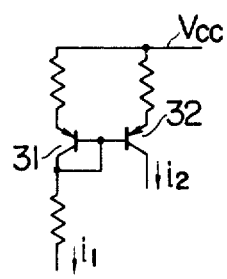
FIGS. 3A, 3B and 3C and FIGS. 4A and 4B are circuit diagrams showing modifications of the portions of the circuit shown in FIG. 1.
Figure 3B:
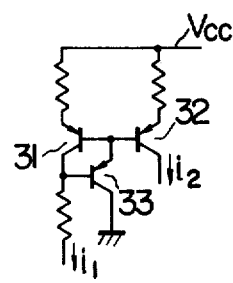
Figure 3C:
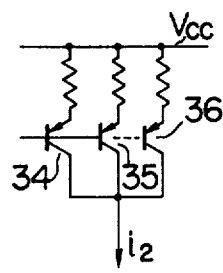

Other embodiments of the circuit according to the invention will now be described. FIGS. 3A, 3B and 3C show modifications of the current supply circuit 100, and the current supply circuit 100 may comprise resistors and transistors 31 and 32 or 31, 32 and 33 as shown in FIG. 3A or 3B so as to function satisfactorily without the temperature compensating transistor 9. On the other hand, as shown in FIG. 3C, a plurality of transistors 34, 35 and 36 for generating the second constant current $i_2$ may be connected in parallel so as to increase the current quantity.

Figure 4A:
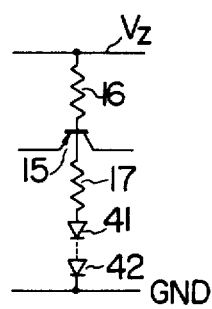
Figure 4B:
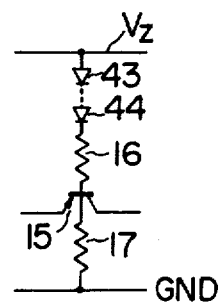

In this case, as shown in FIG. 4A or 4B, diodes 41 and 42 or diodes 43 and 44 may be added to the voltage comparison circuit 300 as shown in FIG. 4A or 4B so as to easily provide the optimum temperature characteristic. In this case, the temperature characteristic of the transistor 15 may be utilized instead of using the diodes 41 to 44.

In addition, instead of using the circuit construction shown in FIG. 1, the voltage comparison circuit 300 may comprise a known type of differential amplifier to form a comparator, and in this case the diode 14 is not required.

Figure 5:
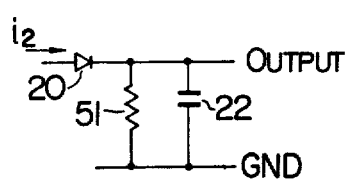
FIG. 5 is a circuit diagram showing an application of the invention as a frequency-to-voltage conversion circuit.

On the other hand, where it is desired to obtain a voltage corresponding to the frequency of the input pulse voltage Vi, as shown in FIG. 5, by providing a resistor 51 in place of the ammeter 24 and suitably selecting its resistance value in consideration of the capacity of the capacitor 22 and the varying frequency range of the input pulse voltage Vi, it is possible to easily obtain an output voltage proportional to the frequency of the voltage Vi. In this case, the output voltage will be in the range from O to $n \cdot C_1 \cdot V_O \cdot f \cdot R_{51} = V_{cc} - (i_2 \cdot R_7 + V_{CE} + V_D)$, and it is possible to generate an output voltage up to practically the power supply voltage Vcc. Here, $R_7$ indicates the resistance value of the resistor 7, $V_{CE}$ the emitter-collector voltage of the transistor 11 and $V_D$ the forward voltage drop of the diode 20, and the combined voltage is on the order of 1 voltage in this embodiment.

While, with the circuit shown in FIG. 1, the capacitor 13 is charged with a constant current so as to detect whether its charged voltage has attained a predetermined value, it is possible to arrange so that one end of the capacitor is connected to one side of the power source (constant voltage source) to pull with a constant current or alternatively it is possible to arrange so that contrary to the construction of FIG. 1, the capacitor is discharged with a constant current to detect its discharged voltage.

It will thus be seen from the foregoing that due to the fact that the circuit of this invention comprises a charge/discharge circuit for charging or discharging with a constant current and a voltage comparison circuit for monitoring the charged or discharged voltage whereby a signal synchronized with each cycle of the input pulse signal and having a predetermined time width is generated and a constant current is generated in accordance with the synchronized signal, the current quantity of output current can be selected as desired without changing for example the capacity of the capacitor in the charge/discharge circuit, and the desired matching with any of various instruments driven by the output current can be easily accomplished. By subjecting the output current to frequency-to-voltage conversion, it is possible to obtain an output voltage practically as high as the power supply voltage.

What is claimed is:

1. A frequency-to-current conversion circuit comprising:
    input means for receiving a train of pulse signals;
    current supply means for supplying first and second constant electric currents;
    a capacitor;

control means for charging said capacitor by said first constant current in response to one of leading and trailing edges of said pulse signals and discharging said capacitor in response to the other of leading and trailing edges of said pulse signals;

comparison means for comparing charged voltage produced across said capacitor with a predetermined voltage; and output means for deriving said second constant current during constant intervals of time determined by subjecting said pulse signals and output signals of said comparison means to a logic operation.

2. A conversion circuit according to claim 1, wherein said control means comprises:

a diode connected in parallel with said capacitor and a transistor the base of which is connected to said input means and the collector-emitter path of which is connected in series with said diode, said transistor charging and discharging said capacitor during non-conduction and conduction thereof, respectively.

3. A conversion circuit according to claim 2, wherein said comparison means comprises:

resistors connected in series for supplying said predetermined voltage at a junction therebetween; and a transistor the base of which is connected to said junction between said resistors and the emitter-collector path of which is connected to said capacitor, said transistor being rendered conductive when said charged voltage across said capacitor is in excess of said predetermined voltage.

4. A conversion circuit according to claim 3, wherein said output means comprises:

a first transistor the base of which is connected to said emitter-collector path of said transistor of said comparison means and the collector-emitter path of which is connected to said current supply means; and a second transistor the base of which is connected to said input means and the collector-emitter path of which is connected to said current supply means, whereby said second constant current supplied by said current supply means is derived during non-conductions of both first and second transistors.

5. A conversion circuit according to claim 4, wherein said current supply means comprises:

a source of electric power;

a third transistor the emitter-collector path of which is connected in series with said source of electric power and said capacitor, said third transistor supplying said first constant current; and a fourth transistor the base of which is connected to the base of said third transistor and the emitter-collector path of which is connected in series with said source of electric power and the collector-emitter paths of said first and second transistors, said fourth transistor supplying said second constant current.

6. A conversion circuit according to claim 5, wherein the base of said third transistor is connected to the collector thereof.

7. A conversion circuit according to claim 5 further comprising a fifth transistor the base of which is connected to the collector of said third transistor and the emitter-collector path of which connects the base of said third and fourth transistors, respectively, to the ground.

8. A conversion circuit according to claim 5, wherein said fourth transistor comprises a parallel circuit of a plurality of transistors.

9. A conversion circuit according to claim 3, wherein said comparison means further comprises temperature compensating diode means.

10. A conversion circuit according to claim 1, wherein said output means further comprises frequency-to-voltage conversion means having a conversion range ranging from zero to a value practically equal to the voltage of said power source.

* * * * *